(12) United States Patent  (10) Patent No.: US 7,573,719 B2
Allcock et al.  (45) Date of Patent: Aug. 11, 2009

(54) APPARATUS AND METHOD FOR HOLDING A CARD

(75) Inventors: David John Allcock, Markham (CA); Hafiz Uddin Talukder, Toronto (CA)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/617,474

(22) Filed: Dec. 28, 2006

(65) Prior Publication Data

US 2008/0158837 A1    Jul. 3, 2008

(51) Int. Cl.
    *H05K 5/00* (2006.01)
(52) U.S. Cl. .................. 361/752; 361/756; 361/759; 211/41.17
(58) Field of Classification Search .............. 211/41.17; 317/101; 439/160; 361/752, 756, 798, 684, 361/759; 339/17 R
See application file for complete search history.

(56) References Cited

U.S. PATENT DOCUMENTS

| | | | | | |
|---|---|---|---|---|---|
| 3,624,587 | A | * | 11/1971 | Conrad | 439/65 |
| 3,775,643 | A | * | 11/1973 | Schachnow et al. | 361/759 |
| 4,377,315 | A | * | 3/1983 | Grau | 439/59 |
| 5,754,404 | A | * | 5/1998 | Biermann et al. | 361/737 |
| 5,829,601 | A | * | 11/1998 | Yurchenco et al. | 211/41.17 |
| 5,841,074 | A | * | 11/1998 | Egan et al. | 174/250 |
| 6,166,917 | A | * | 12/2000 | Anderson | 361/756 |
| 6,504,728 | B1 | * | 1/2003 | Cuong dac Ta | 361/801 |
| 6,687,134 | B2 | * | 2/2004 | Vinson et al. | 361/798 |
| 7,083,447 | B2 | * | 8/2006 | Greiser | 439/160 |

* cited by examiner

*Primary Examiner*—Dean A. Reichard
*Assistant Examiner*—Andargie M Aychillhum
(74) *Attorney, Agent, or Firm*—GE Global Patent Operation; Roger C. Phillips

(57) ABSTRACT

Disclosed is a holding apparatus for a card used in a computing resource, the apparatus including a holding base, and at least one card associating arm extending from the base, the at least one associating arm being configured to hold the card via a screwless association.

12 Claims, 6 Drawing Sheets

APPARATUS AND METHOD FOR HOLDING A CARD

FIELD OF THE INVENTION

The disclosure relates generally to an apparatus for holding a card, and more particularly to an apparatus for holding a card without a threaded association with the card.

BACKGROUND OF THE INVENTION

Logic boards for computing resources, such a printed circuit boards, motherboards, sister boards, and node cards, typically need to be attached to card holders before mounting in a final enclosure. Generally these cards are attached to card holders via release handles that are screwed into place on the holder.

However, this type of threaded attaching can be expensive to a user in both parts and labor. As such, there is a desire for an easier and less expensive means of attaching a logic card to a card holder.

BRIEF DESCRIPTION OF THE INVENTION

Disclosed is a holding apparatus for a card used in a computing resource, the apparatus including a holding base, and at least one card associating arm extending from the base, the at least one associating arm being configured to hold the card via a screwless association.

Also disclosed is a card holding apparatus for use in a computing resource, the apparatus including a card holder that includes a base and at least one card associating arm extending from the base, and a card for use in the computing resource, the card being screwlessly associated with the at least one card associating arm of the card holder.

Further disclosed is a method for holding a card used in a computing resource, the method including screwlessly associating the card with at least one arm extending from a base of a card holder, and holding the card with the at least one arm via at least one of a grooved frictional fit and an interference fit.

BRIEF DESCRIPTION OF THE DRAWINGS

The following descriptions should not be considered limiting in any way. With reference to the accompanying drawings, like elements are numbered alike.

DETAILED DESCRIPTION OF THE INVENTION

Figure 1:
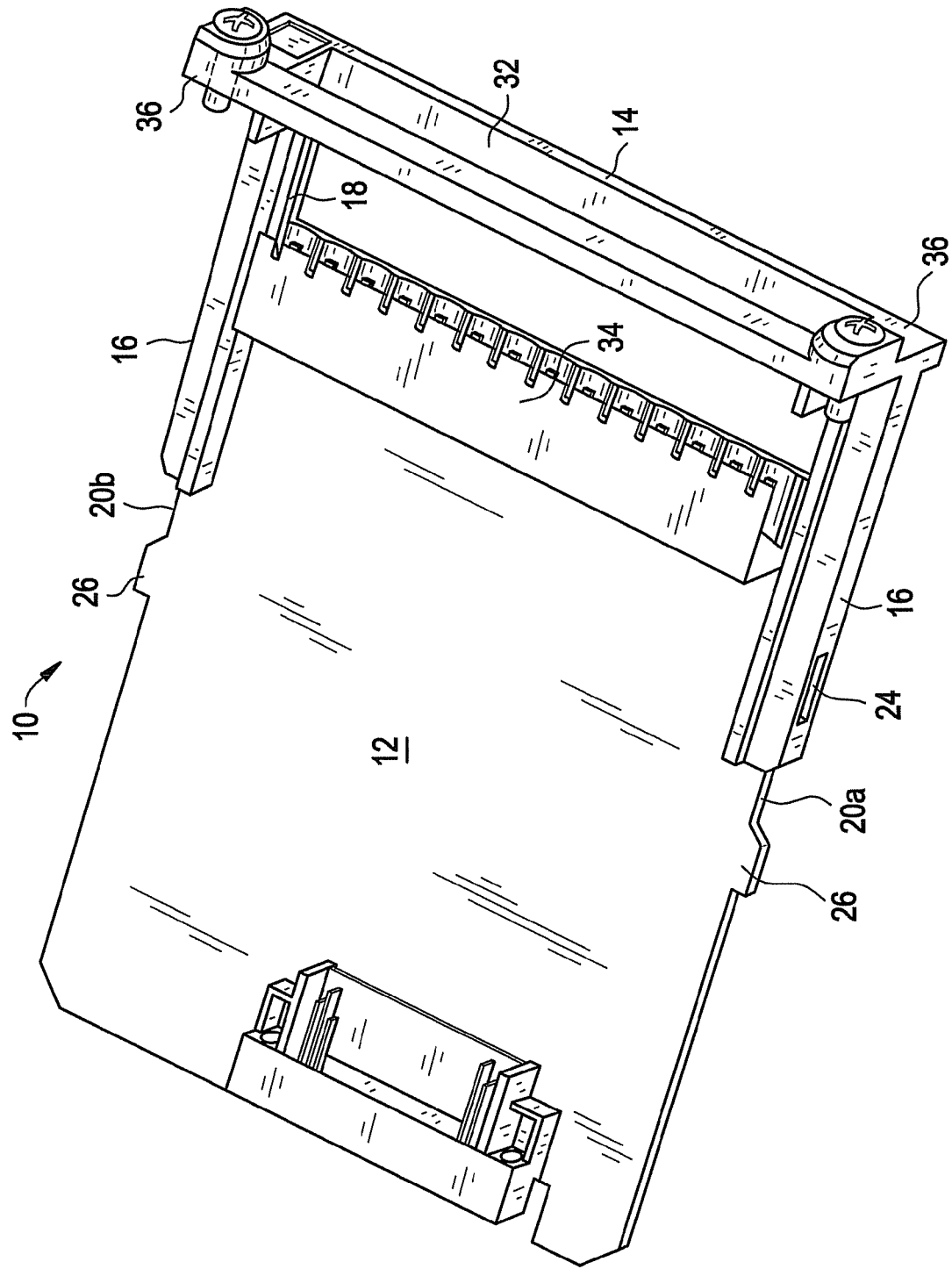
FIG. 1 is a perspective view of an apparatus for holding a card used in a computing resource.
Figure 2:
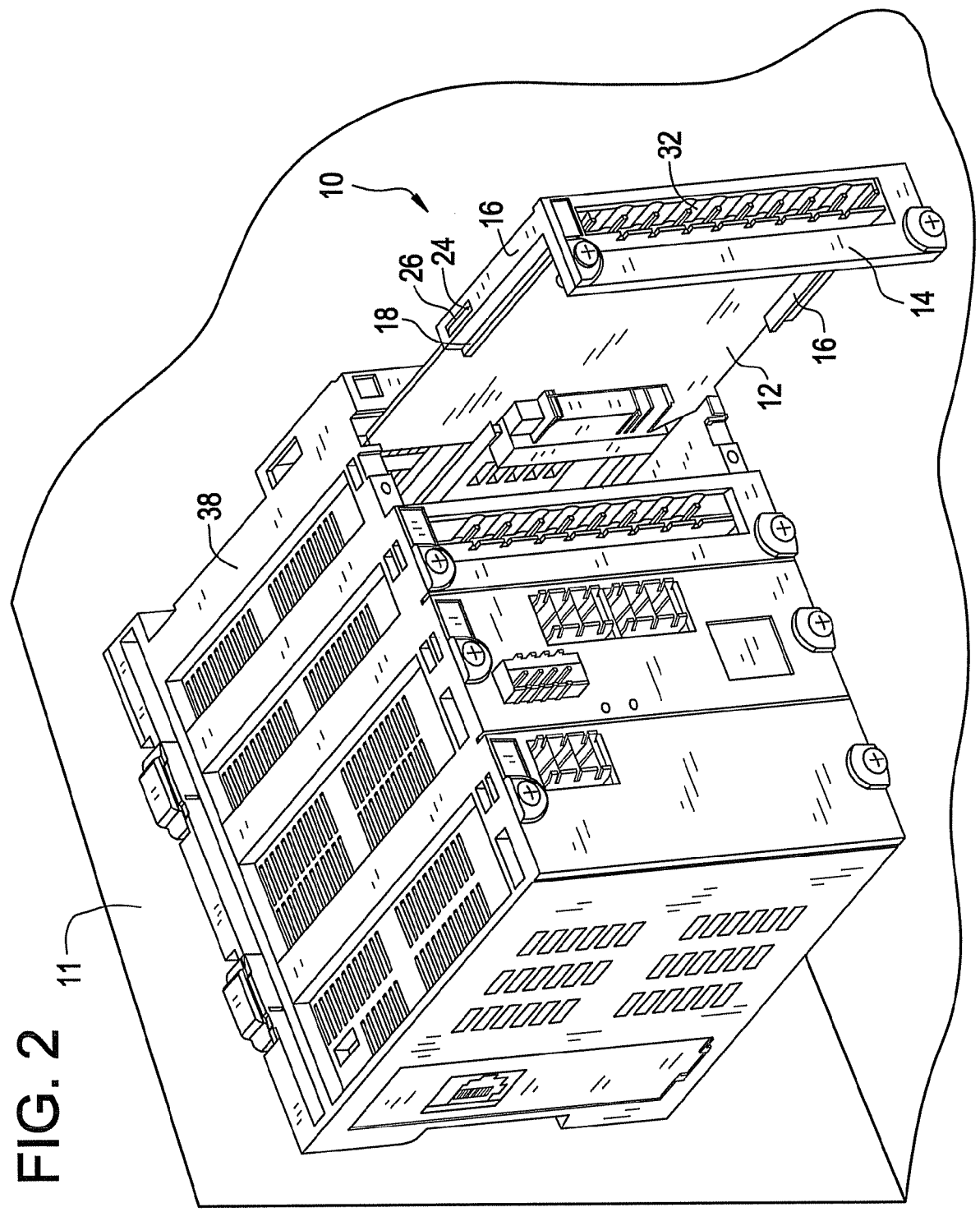
FIG. 2 a perspective view of the apparatus for holding a card used in a computing resource, and a chassis.
Figure 3:
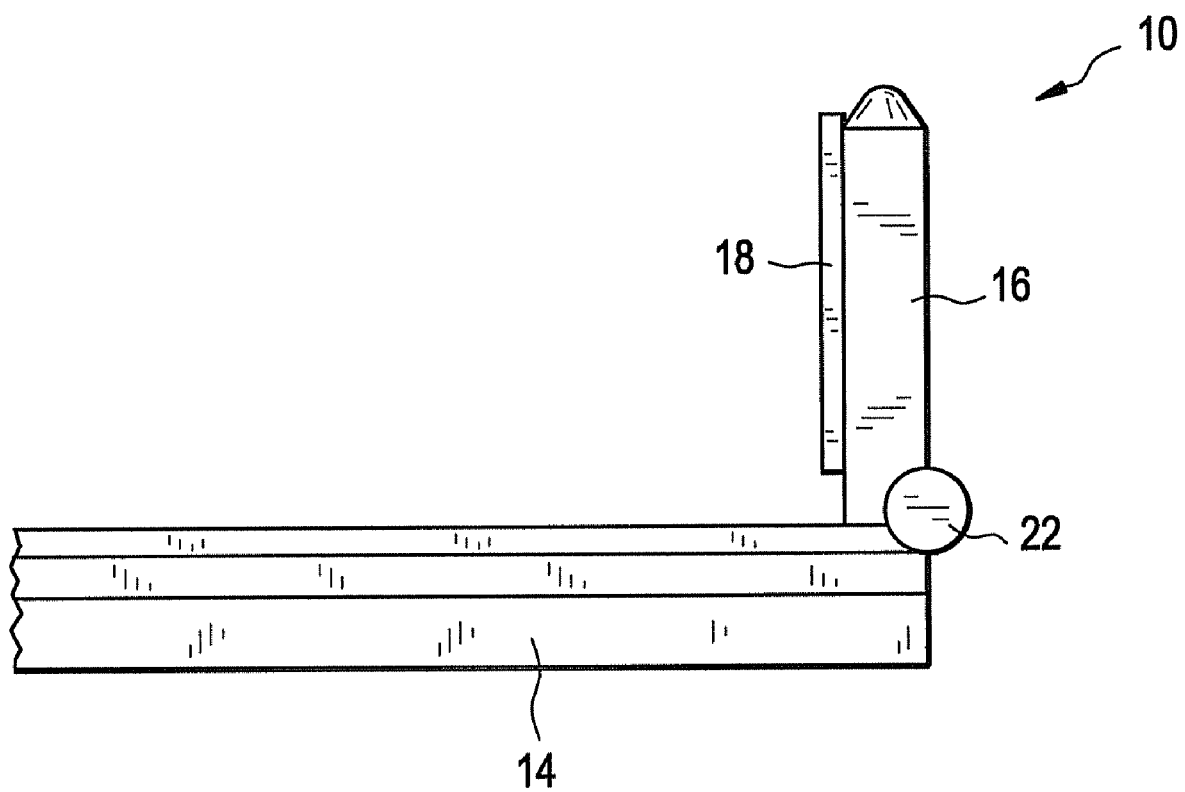
FIG. 3 is a partial schematic top view of the apparatus for holding a card used in a computing resource, including a hinge.
Figure 4:
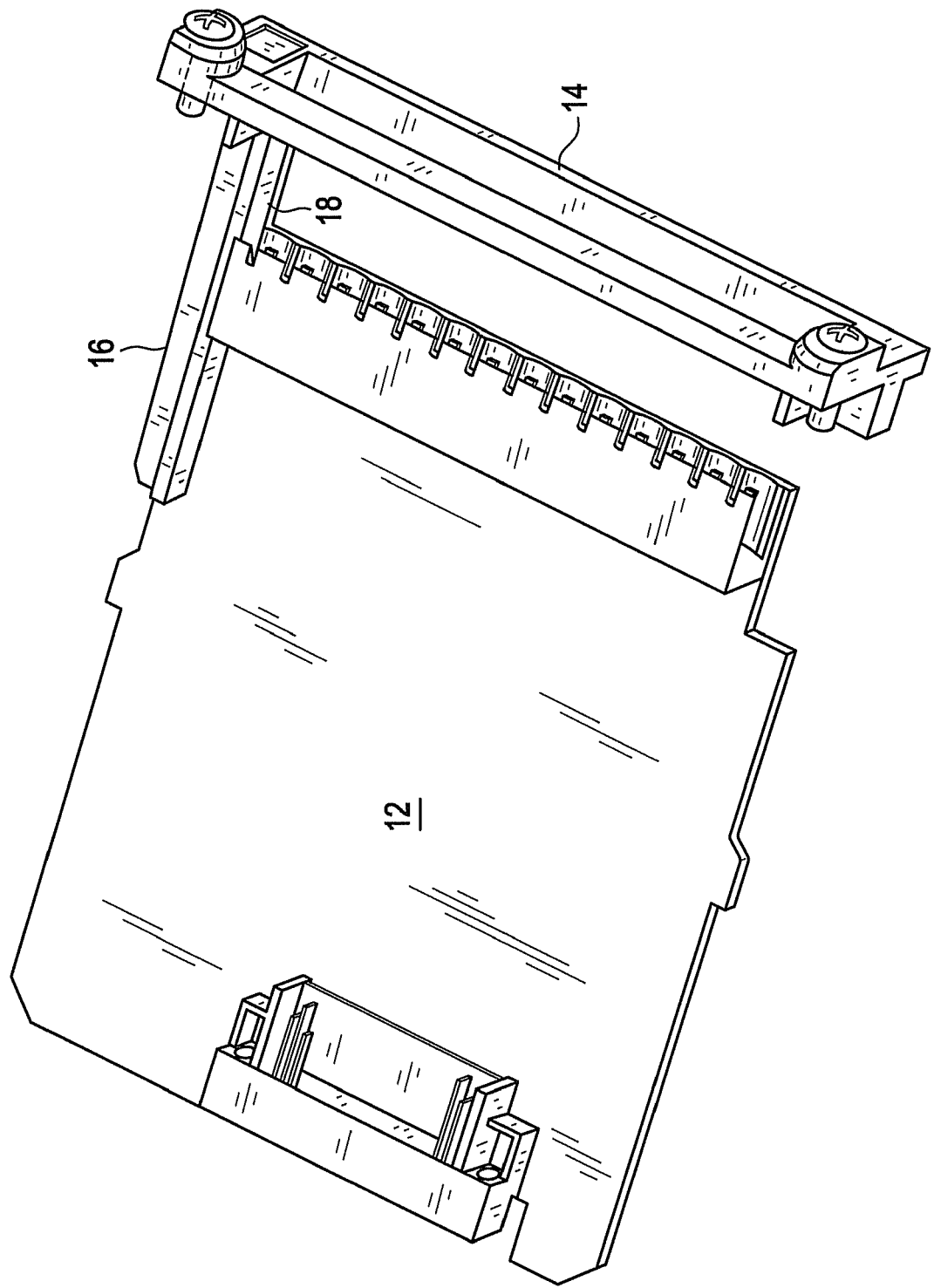
FIG. 4 is a perspective view of the apparatus for holding a card used in a computing resource, the apparatus including one arm.

Referring to FIGS. 1-4, a first embodiment of an apparatus 10 for a card 12 used in a computing resource 11 is illustrated. The apparatus 10 (which may also be referred to as a card holder 10) includes a card base 14 and at least one card associating arm 16 extending from the base 14. In this embodiment, the arms (as shown in FIGS. 1 and 2) or arm 16 (as shown in FIG. 4) screwlessly associate with the card 12 via an associating groove 18 defined by the arms or arm 16. The groove 18 or grooves 18 are configured for containing at least a portion of the card 12 via a grooved frictional fit. Throughout this and other embodiments in the disclosure, it should be appreciated that the card 12 may be any card usable with a computing resource, such as a printed circuit board card, a mother board, a sister card, and a node card.

Referring now to FIGS. 1 and 2 in particular, the apparatus 10 is illustrated with two arms 16 extending from the base 14. Each of the two arms 16 includes the grooves 18, which are configured to hold opposite edges 20a-b the card 12. The grooves 18 hold the card 12 via (at least) the grooved frictional fit mentioned above, wherein ridges of the grooves 18 are configured/sized to essentially grip the edges 20a-b of the card 12. In this manner, the grooves 18 securely associates the card 12 to the holding apparatus 10.

When the apparatus 10 includes two arms 16, as illustrated in FIGS. 1 and 2, the two arms 16 may also employ an interference fitting of the card 12 between the two arms 16, wherein the card 12 is held in place via both a frictional fit (via the grooves 18) and an interference fit. The interference fit may be accomplished via any means desirable, such as constructing the arms 16 of a flexible resilient material (such as a resilient plastic or rubber), or an arm 16 that is associated with the base 14 via resilient hinge 22 (such as a spring hinge as shown in FIG. 3). In either case, the resiliency of at least one of the arms 16 will provide a consistent holding force on the card 12 if the card 12 includes a width that is greater (typically slightly greater) than a distance between the arms 16. The holding force is applied when the card 12 is disposed between and in contact with the arms 16, with the edges 20a-b disposed in the grooves 18.

Provision of flexible and resilient arms 16 as discussed above further allows the apparatus 10 to employ at least one detent 24 configured for containing flanges 26 extending from at least one of the edges 20a-b of the card 12. In this embodiment, the detent(s) 24 are disposed within at least one of the grooves 18, and may extend completely through the arms 16 in which the detents 24 are disposed. The flexibility of the arms 16 allows the arms 16 to be pushed away from each other as the flange(s) 26 enter and contact a surface of at least one of the grooves 18. This pushing away will continue until the flange(s) 26 reach the detent(s) 24. At this point, the flange(s) 26 enter the detent(s) 24, allowing at least one of the arms 16 to move back towards the edge(s) 20a-b of the card 12. This disposal of the flange(s) 26 within the detent(s) 24 snaps the card 12 into a "locked" association with the apparatus 10, as shown in FIG. 2. Though the Figures illustrate detents 24 that are disposed on a surface located between the groove's ridges, it should be appreciated that these detents 24 may be disposed on any surface of the grooves 18 or arms 16, including any ridge surface of the grooves 18.

As is also illustrated in FIGS. 1 and 2, it should also be appreciated that the base 14 of the apparatus 10 may define an access opening 32 that allows access to a connecting portion 34 of the card 12, such as a cable or internet connection. Furthermore, the base 14 may define at least one chassis association opening 36 that allows the apparatus 10, and therefore the card 12, to be securely associated with a chassis 38 of the computing resource 11.

It should additionally be appreciated that in a two-arm configuration, one of the arms 16 may be configured without the groove 18, whether the apparatus employs an interference fit or not.

Referring specifically now to FIG. 4, it should further be appreciated that the apparatus may employ only one arm 16, wherein the one arm 16 sufficiently holds the card via a frictional fit with the groove 18. This groove 18, or any groove 18 (such as those used in a two arm 16 configuration, with or without an interference fit configuration) may employ an adhesive substance disposed within the groove 18, wherein the adhesive substance further aids in providing a secure association between the apparatus and the card 12.

Figure 5:
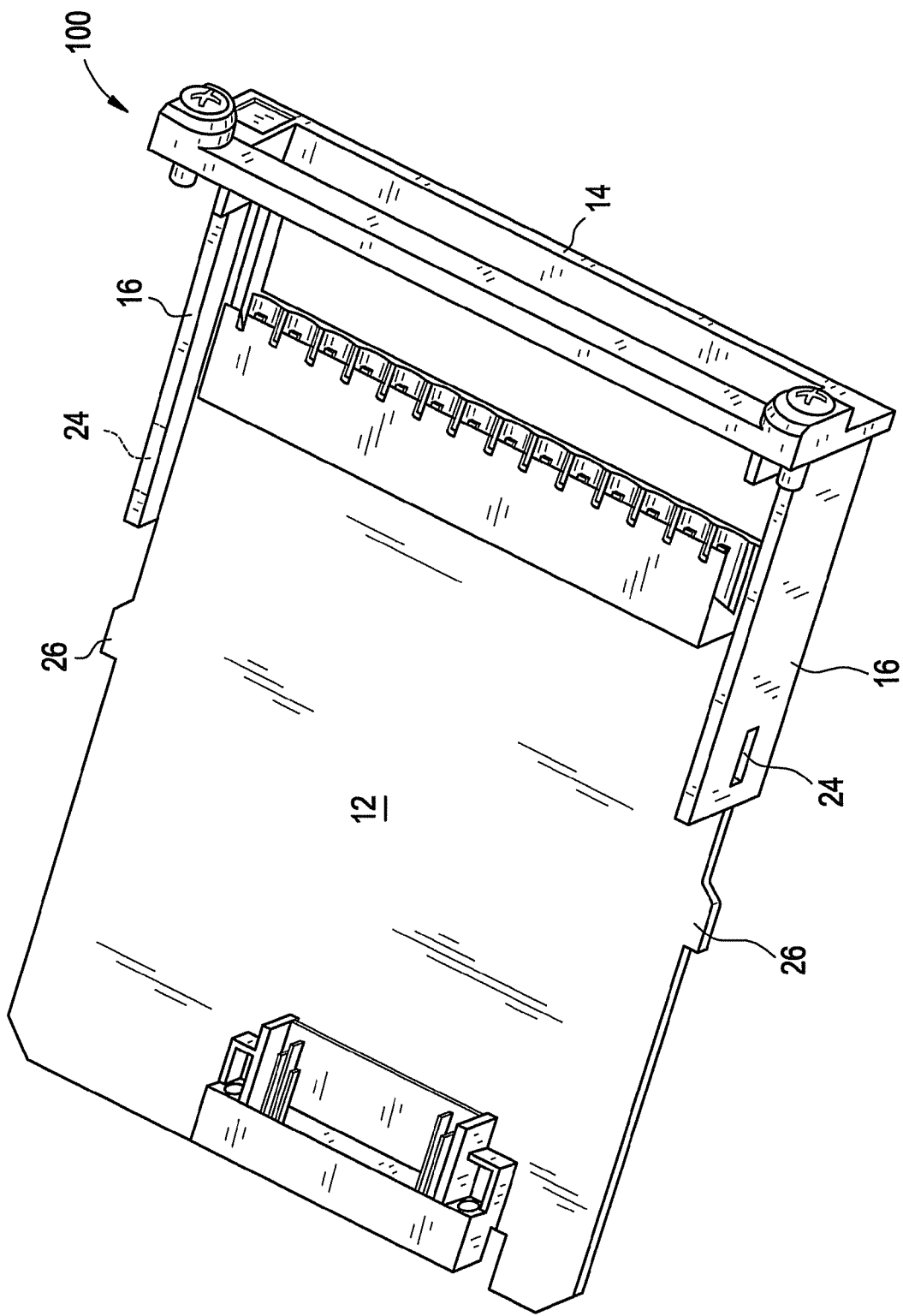
FIG. 5 is a perspective view of another embodiment of an apparatus for holding a card used in a computing resource.

Referring specifically now to FIG. 5, another embodiment of an apparatus 100 for a card 12 used in a computing resource is illustrated. The apparatus 100 (which may also be referred to as a card holder 100) resembles the apparatus 10 and includes many of the features and provisions thereof. Common elements are represented herein and throughout by consistent reference numerals and, for the sake of brevity, are not reintroduced nor unnecessarily re-described. The apparatus 100 significantly differs from the apparatus 10 in that the apparatus 100 requires two arms 16. The apparatus 100 does not need to employ a grooved frictional fit to hold the card 12, and as such, grooves are not illustrated with the arms 16.

In this embodiment, the arms 16 screwlessly associate with the card 12 via the interference fit as discussed with reference to the embodiment of apparatus 10. As shown in FIG. 5, at least one of these arms 16 may employ at least one detent 24. As is also discussed with reference to the embodiment of apparatus 10, the detent(s) may associate with the flange(s) that may extend from the edges 20*a-b* of the card 12, aiding in provision of a secure association between the card 12 and apparatus 10.

It should be appreciated, that though a frictional fit is unnecessary to this embodiment, a groove (such as the grooves 18 discussed above) may be disposed with either or both of the arms 16 of the apparatus 100. If grooves are employed with this apparatus 100, they may act either as guides for the edges 20*a-b* of the card 12, and/or offer the grooved frictional fit discussed above.

Figure 6:
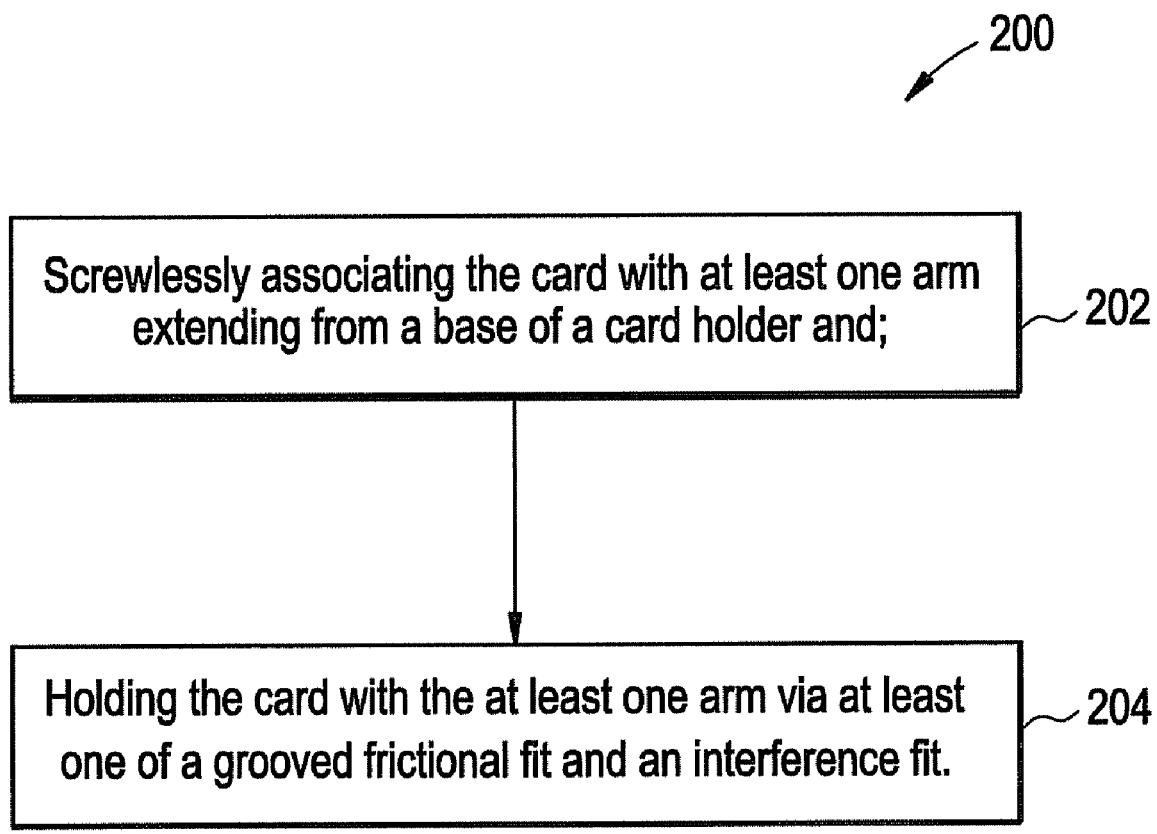
FIG. 6 is a block diagram illustrating a method for holding a card used in a computing resource.

Referring to FIG. 6, a method 200 for holding a card 12 used in a computing resource 11, the method including screwlessly associating the card 12 with at least one arm 16 extending from a base 14 of a card holder 10 or 100, as shown in operational block 202, and holding the card 12 with the at least one arm 16 via at least one of a grooved frictional fit and an interference fit, as shown in operational block 204.

While the embodiments of the disclosed method and apparatus have been described with reference to exemplary embodiments, it will be understood by those skilled in the art that various changes may be made and equivalents may be substituted for elements thereof without departing from the scope of the embodiments of the disclosed method and apparatus. In addition, many modifications may be made to adapt a particular situation or material to the teachings of the embodiments of the disclosed method and apparatus without departing from the essential scope thereof. Therefore, it is intended that the embodiments of the disclosed method and apparatus not be limited to the particular embodiments disclosed as the best mode contemplated for carrying out the embodiments of the disclosed method and apparatus, but that the embodiments of the disclosed method and apparatus will include all embodiments falling within the scope of the appended claims.

What is claimed is:

1. A holding apparatus for a processor card used in a computing resource, the processor card comprising opposed edges and opposed surfaces connected therewith, the holding apparatus comprising:

a holding base having a longitudinal axis; and a pair of spaced arms extending from opposing ends of the holding base, each spaced arm extending in a generally orthogonal direction to the longitudinal axis of the holding base and each spaced arm comprising an association groove for receiving one of the opposing edges of the processor card, wherein the spaced arms are configured to be flexible and resilient and further being configured for snap locking with the processor card;

wherein said pair of spaced arms solely support and directly grip the opposed edges of the processor card in a fastenerless connection such that inner surfaces defining each association groove directly contact one edge and opposed surfaces of the processor card, wherein said edge where said direct gripping occurs is free of electrical connectors.

2. The apparatus of claim 1, wherein said association grooves each include at least one detent configured for containing a flange extending from at least one edge of the card.

3. The apparatus of claim 1, wherein the card is at least one of a printed circuit board card, a mother board, a sister card, and a node card.

4. The apparatus of claim 1, wherein said holding base defines at least one access opening for access to a connecting portion of the card.

5. The apparatus of claim 1, wherein said holding base defines at least one chassis association opening for association to a chassis.

6. The apparatus of claim 2, wherein said at least one detent extends completely through at least one of said spaced arms.

7. A processor card holding apparatus for use in a computing resource, the apparatus comprising:

a processor card comprising opposed edges and opposed surfaces connected therewith; and a holding apparatus comprising:

a holding base having a longitudinal axis; and a pair of spaced arms extending from opposing ends of the holding base, each spaced arm extending in a generally orthogonal direction to the longitudinal axis of the holding base and each spaced arm comprising an association groove for receiving one of the opposing edges of the processor card, wherein the spaced arms are configured to be flexible and resilient and further being configured for snap locking with the processor card;

wherein said pair of spaced arms solely support and directly grip the opposed edges of the processor card in a fastenerless connection such that inner surfaces defining each association groove directly contact one edge and opposed surfaces of the processor card, wherein said edge where said direct gripping occurs is free of electrical connectors.

8. The apparatus of claim 7, wherein said processor card comprises a flange extending from each of said opposed edges and wherein said association grooves each include at least one detent configured for containing each flange extending from the opposed edges of the processor card.

9. The apparatus of claim 7, wherein said at least one detent extends completely through at least one of said spaced arms.

10. The apparatus of claim 7, wherein the card is at least one of a printed circuit board card, a mother board, a sister card, and a node card.

11. The apparatus of claim 7, wherein said holding base defines at least one access opening for access to a connecting portion of the card.

12. The apparatus of claim 7, wherein said holding base defines at least one chassis association opening for association to a chassis.

* * * * *